(12) United States Patent
Uemichi

(10) Patent No.: US 12,212,029 B2
(45) Date of Patent: Jan. 28, 2025

(54) DIGITAL PHASE SHIFTER

(71) Applicant: Fujikura Ltd., Tokyo (JP)

(72) Inventor: Yusuke Uemichi, Sakura (JP)

(73) Assignee: Fujikura Ltd., Tokyo (JP)

( * ) Notice: Subject to any disclaimer, the term of this patent is extended or adjusted under 35 U.S.C. 154(b) by 0 days.

(21) Appl. No.: 17/923,071

(22) PCT Filed: Aug. 8, 2022

(86) PCT No.: PCT/JP2022/030228
§ 371 (c)(1),
(2) Date: Nov. 3, 2022

(87) PCT Pub. No.: WO2023/157340
PCT Pub. Date: Aug. 24, 2023

(65) Prior Publication Data
US 2024/0304968 A1    Sep. 12, 2024

(30) Foreign Application Priority Data

Feb. 18, 2022   (JP) ................. 2022-024007

(51) Int. Cl.
*H01P 1/18* (2006.01)
*H01Q 3/38* (2006.01)
*H03H 7/20* (2006.01)

(52) U.S. Cl.
CPC ............... *H01P 1/184* (2013.01); *H01Q 3/38* (2013.01); *H03H 7/20* (2013.01)

(58) Field of Classification Search
CPC .. H01P 1/184; H01P 1/185; H01P 1/18; H01P 5/08; H01P 3/003; H01P 3/006;
(Continued)

(56) References Cited

U.S. PATENT DOCUMENTS 6,816,031 B1   11/2004  Miller
10,291,282 B1   5/2019  Lin et al.
(Continued)

FOREIGN PATENT DOCUMENTS

CN   106785250 A   5/2017
CN   109616723 A   4/2019
(Continued)

OTHER PUBLICATIONS

Sadhu, Bodhisatwa et al: "A 28-GHz 32-Element TRX Phased-Array IC With Concurrent Dual-Polarized Operation and Orthogonal Phase and Gain Control for 5G Communications", IEEE Journal of Solid-State Circuits, IEEE, USA, vol. 52, No. 12, Dec. 1, 2017 (Dec. 1, 2017), pp. 3373-3391, XP011673305, ISSN: 0018-9200, DOI:10.1109/JSSC.2017.2766211; Cited in EP search report dated Oct. 24, 2023. (19 pages).

(Continued)

*Primary Examiner* — John W Poos
(74) *Attorney, Agent, or Firm* — WHDA, LLP

(57) ABSTRACT

A digital phase shifter of the present invention is a digital phase shifter in which digital phase shift circuits are cascade-connected, each of the digital phase shift circuits including a signal line, a pair of inner lines provided on both sides of the signal line, a pair of outer lines provided on outer sides of the inner lines, a first ground conductor connected to one ends of the inner lines and one ends of the outer lines, a second ground conductor connected to the other ends of the outer lines, and a pair of electronic switches provided between the other ends of the inner lines and the second ground conductors. The digital phase shift circuits include a multi-row structure constituted by a front row and a rear row, and an inter-row connection structure in which the outer line in the front row and the outer line in the rear row are connected, and the number of the digital phase shift circuits from an input end of an uppermost side digital phase shift circuit in the front row to an input end of an uppermost side digital phase shift circuit in the rear row is set such that a phase of a signal input to the front row uppermost side digital phase shift circuit and a phase of a signal input to the rear row uppermost side digital phase shift circuit are anti-phase with each other.

6 Claims, 7 Drawing Sheets

(58) Field of Classification Search
CPC .... H01P 5/028; H01P 5/16; H01P 9/00; H01P 1/182; H01P 3/00; H01P 5/184; H01P 7/082; H01P 9/006; H01P 1/227; H01P 3/10; H01P 5/085; H01Q 3/38; H03H 7/20; H03H 7/185

See application file for complete search history.

(56) References Cited

U.S. PATENT DOCUMENTS

| | | | | |
|---|---|---|---|---|
| 10,608,335 | B2 * | 3/2020 | Valdes Garcia | H04B 1/00 |
| 2014/0312986 | A1 * | 10/2014 | Edelstein | H01P 3/006 |
| | | | | 333/33 |
| 2014/0315500 | A1 * | 10/2014 | Ding | H03K 17/687 |
| | | | | 455/77 |
| 2019/0157754 | A1 * | 5/2019 | Valdes Garcia | H04B 1/00 |
| 2019/0158068 | A1 | 5/2019 | Valdes Garcia et al. | |

FOREIGN PATENT DOCUMENTS

| | | |
|---|---|---|
| CN | 111326839 A | 6/2020 |
| JP | 2011-259215 A | 12/2011 |
| JP | 2016-158035 A | 9/2016 |

OTHER PUBLICATIONS

International Search Report dated Oct. 4, 2022, issued in counterpart International Application No. PCT/JP2022/030228, with Japanese. (3 pages).

Tousi et al., "A Ka-band Digitally-Controlled Phase Shifter with sub-degree Phase Precision", (2016), IEEE, Radio Frequency Integrated Circuits Symposium, pp. 356-359. Cited in Specification. (4 pages).

* cited by examiner

DIGITAL PHASE SHIFTER

TECHNICAL FIELD

The present invention relates to a digital phase shifter.

Priority is claimed on Japanese Patent Application No. 2022-024007, filed Feb. 18, 2022, the content of which is incorporated herein by reference.

BACKGROUND ART

Non Patent Document 1, which are described below, discloses digital control type phase shift circuits (digital phase shift circuits) that use microwaves, sub-millimeter waves, millimeter waves, or the like. As shown in FIG. 2 of Non Patent Document 1, the digital phase shift circuit includes a signal line, a pair of inner lines provided on both sides of the signal line, a pair of outer lines provided on outer sides of the pair of inner lines, a first ground bar connected to one ends of the pair of inner lines and the pair of outer lines, a second ground bar connected to the other ends of the pair of outer lines, a pair of NMOS switches provided between the other ends of a pair of inner lines and the second ground bar, and the like.

Such a digital phase shift circuit switches an operation mode between a low delay mode and a high delay mode by switching a return current flowing through the pair of inner lines or the pair of outer lines due to transmission of a signal wave in the signal line according to opening/closing of the pair of NMOS switches. That is, in the digital phase shift circuit, an operation mode is the low delay mode when the return current flows through the pair of inner lines, and an operation mode is the high delay mode when a return current flows through the pair of outer lines.

RELATED ART DOCUMENTS

Non Patent Document

[Non Patent Document 1]
A Ka-band Digitally-Controlled Phase Shifter with sub-degree Phase Precision (2016, IEEE, RFIC)

SUMMARY OF INVENTION

Problem to be Solved by the Invention

Incidentally, the digital phase shift circuit is applied to a base station or the like using, for example, a phased array antenna, and the digital phase shift circuits are mounted on a semiconductor substrate in a state in which they are cascade-connected actually. That is, the digital phase shift circuit is a unit in the configuration of the actual phase shifter, and a digital phase shifter is configured as dozens of digital phase shift circuits that are cascade-connected to constitute each stage. The digital phase shifter realizes a plurality of phase shift quantities as a whole by setting a unit of each stage to the low delay mode or the high delay mode.

When such a digital phase shifter is mounted on the semiconductor substrate, digital phase shift circuits (units) may be disposed in a multi-row state due to restrictions of a mounting space or the like. Then, in the digital phase shifter of the above-mentioned multi-row structure, lines which are grounded, such as two outer lines neighboring between rows, or the first ground bar and second ground bar neighboring between the rows may be connected to each other to form an integrated ground pattern. In the digital phase shifter of the multi-row structure and the inter-row connection structure, since mutual interference between the digital phase shift circuits in neighboring rows occurs, it is necessary to suppress the mutual interference as much as possible.

In consideration of the above-mentioned circumstances, the present invention is directed to providing a digital phase shifter capable of suppressing mutual interference between digital phase shift circuits in neighboring rows in a multi-row structure and an inter-row connection structure.

Means for Solving the Problem

In order to achieve the aforementioned objects, as a first solving means, a digital phase shifter according to the present invention is a digital phase shifter in which digital phase shift circuits are cascade-connected, each of the digital phase shift circuits including at least a signal line, a pair of inner lines provided on both sides of the signal line, a pair of outer lines provided on outer sides of the inner lines, a first ground conductor connected to one ends of the inner lines and one ends of the outer lines, a second ground conductor connected to the other ends of the outer lines, and a pair of electronic switches provided between the other ends of the inner lines and the second ground conductor, the digital phase shift circuits including a multi-row structure constituted by a front row and a rear row by being connected through a predetermined connection circuit, and an inter-row connection structure in which the outer line in the front row and the outer line in the rear row neighboring in at least an inter-row direction are connected by a predetermined ground pattern, and a number of the digital phase shift circuits from an input end of a front row uppermost side digital phase shift circuit located on an uppermost side in the front row to an input end of a rear row uppermost side digital phase shift circuit located on an uppermost side in the rear row is set such that a phase of a signal input to the front row uppermost side digital phase shift circuit and a phase of a signal input to the rear row uppermost side digital phase shift circuit are anti-phase with each other.

As a second solving means, according to the digital phase shifter of the present invention, in the first solving means, the number may be 8 to 14 when a frequency band of the signal is 24 to 30 GHz.

As a third solving means, according to the digital phase shifter of the present invention, in the second solving means, the number may be 8 to 14 when a multilayer structure is formed in at least one of a region between the outer line and the inner line on both or one of the first ground conductor and the second ground conductor and a region on the outer line.

As a fourth solving means, according to the digital phase shifter of the present invention, in the second solving means, the number may be 8 to 12 when a distance from the signal line to the inner line is set to less than 10 μm.

As a fifth solving means, according to the digital phase shifter of the present invention, in any one of the first to fourth solving means, the digital phase shift circuit may include a capacitor including an upper electrode connected to the signal line and a lower electrode connected to at least one of the first ground conductor and the second ground conductor.

As a sixth solving means, according to the digital phase shifter of the present invention, in the fifth solving means, the digital phase shift circuit may further include an electronic switch for the capacitor between the lower electrode of the capacitor and at least one of the first ground conductor and the second ground conductor.

Effects of the Invention

According to the present invention, it is possible to provide a digital phase shifter capable of suppressing mutual interference between digital phase shift circuits in neighboring rows in a multi-row structure and an inter-row connection structure.

EMBODIMENTS FOR CARRYING OUT THE INVENTION

Hereinafter, embodiments of the present invention am described with reference to the accompanying drawings.

First Embodiment

Figure 1:
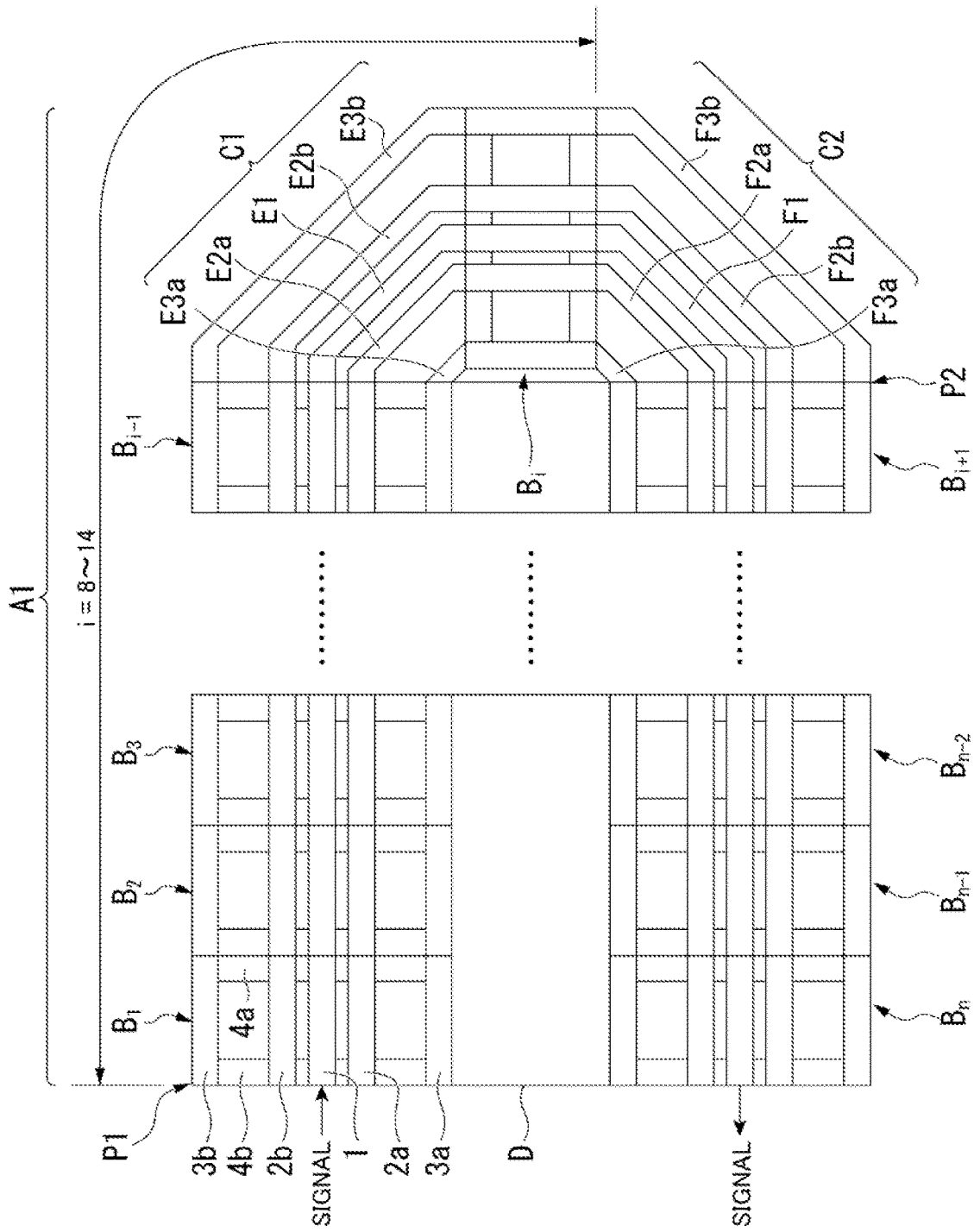
FIG. 1 is a plan view showing a configuration of a digital phase shifter A1 according to a first embodiment of the present invention.

First, a first embodiment of the present invention are described. As shown in FIG. 1, a digital phase shifter A1 according to the first embodiment is a high frequency circuit configured to output a high frequency signal with a phase shifted by a predetermined phase shift quantity to the outside using a signal (a high frequency signal) such as microwaves, sub-millimeter waves, millimeter waves, or the like, as an input.

As shown in FIG. 1, the digital phase shifter A1 includes a plurality of ("n") digital phase shift circuits B1 to Bn, a pair of connection circuits C1 and C2, and a ground pattern D. Further, in the present embodiment, the above-mentioned "n" is a natural number. In addition, the following "i" is a natural number of 2 or more and "n" or less.

As shown in the drawings, the "n" (plurality of) digital phase shift circuits B1 to Bn are disposed in two rows (multiple rows) through the pair of connection circuits C1 and C2. That is, the digital phase shifter A1 according to the first embodiment includes a multi-row structure related to the digital phase shift circuits B1 to Bn using the pair of connection circuits C1 and C2. Further, a two-row structure shown in FIG. 1 is an example of the multi-row structure, and the number of rows may be three or more.

While described below in detail, as representatively shown in the digital phase shift circuit B1, each of the digital phase shift circuits B1 to Bn includes a signal line 1, two inner lines 2 (a first inner line 2a and a second inner line 2b), two outer lines 3 (a first outer line 3a and a second outer line 3b), two ground conductors 4 (a first ground conductor 4a and a second ground conductor 4b), and the like.

In the digital phase shifter A1, a transmission direction of a high frequency signal is a direction from a first digital phase shift circuit B1 toward an n-th digital phase shift circuit Bn. The first digital phase shift circuit B1 is positioned on the uppermost side (the foremost stage) in the transmission direction of the high frequency signal, and the n-th digital phase shift circuit Bn is located on the lowermost side (the final stage) in the transmission direction of the high frequency signal.

In the "n" digital phase shift circuits B1 to Bn, the first to (i−1)-th digital phase shift circuits B1 to B(i−1) constitute a front row (a first row), and are cascade-connected linearly. Meanwhile, the (i+1)-th to n-th digital phase shift circuits B(i+1) to Bn constitute a rear row (a second row), and are cascade-connected linearly. The front row (the first row) and the rear row (the second row) are provided substantially in parallel through the pair of connection circuits C1 and C2 and the i-th digital phase shift circuit Bi.

In the first to (i−1)-th digital phase shift circuits B1 to B(i−1) of the front row (the first row), the signal lines 1 neighboring in the row direction are serially connected in a row. In addition, in the (i+1)-th to n-th digital phase shift circuits B(i+1) to Bn of the rear row (the second row), the signal lines 1 neighboring in the row direction are serially connected in a row.

In addition, in the first to (i−1)-th digital phase shift circuits B1 to B(i−1) of the front row (the first row), the first inner lines 2a neighboring in the row direction (an extension direction of the front row and the rear row), the second inner lines 2b neighboring in the row direction, the first outer lines 3a neighboring in the row direction, and the second outer lines 3b neighboring in the row direction are respectively serially connected in a row. In addition, in the (i+1)-th to n-th digital phase shift circuits B(i+1) to Bn of the rear row (the second row), the first inner lines 2a neighboring in the row direction, the second inner lines 2b neighboring in the row direction, the first outer lines 3a neighboring in the row direction and the second outer lines 3b neighboring in the row direction are respectively serially connected in a row.

In addition, in the first to (i−1)-th digital phase shift circuits B1 to B(i−1) of the front row (the first row), the first ground conductor 4a and the second ground conductor 4b neighboring in the row direction are connected to each other. In addition, in the (i+1)-th to n-th digital phase shift circuits B(i+1) to Bn of the rear row (the second row), the first ground conductor 4a and the second ground conductor 4b neighboring in the row direction are connected to each other. That is, in the first to (i−1)-th digital phase shift circuits B1 to B(i−1) of the front row (the first row), or in the (i+1)-th to n-th digital phase shift circuits B(i+1) to Bn of the rear row (the second row), the first ground conductor 4a of one digital phase shift circuit and the second ground conductor 4b of another digital phase shift circuit neighboring in the row direction are connected to each other.

The first to (i−1)-th digital phase shift circuits B1 to B(i−1) of the front row (the first row) and the (i+1)-th to n-th digital phase shift circuits B(i+1) to Bn of the rear row (the second row) have a relation neighboring between the rows.

In the first to (i−1)-th digital phase shift circuits B1 to B(i−1) of the front row (the first row) and the (i+1)-th to n-th digital phase shift circuits B(i+1) to Bn of the rear row (the second row) having a relation neighboring between the rows, at least ones of the first outer lines 3a neighboring in an inter-row direction (a direction in which the front row and the rear row are adjacent to each other), the first ground conductor 4a and the second ground conductor 4b neighboring in an inter-row direction, and the second ground conductor 4b and the first ground conductor 4a neighboring in an inter-row direction are connected to each other through the ground pattern D.

That is, the ground pattern D connects at least ones of the first outer lines 3a neighboring in the inter-row direction, the first ground conductor 4a and the second ground conductor 4b neighboring in the inter-row direction, and the second ground conductor 4b and the first ground conductor 4a neighboring in the inter-row direction, which are electrically grounded. The digital phase shifter A1 including the ground pattern D includes an inter-row connection structure.

Here, in the digital phase shifter A1 according to the first embodiment, among the "n" digital phase shift circuits B1 to Bn, the i-th digital phase shift circuit Bi constitutes neither the front row (the first row) nor the rear row (the second row), and is disposed while being sandwiched between the pair of connection circuits C1 and C2. However, the i-th digital phase shift circuit Bi may be disposed to constitute the front row (the first row).

The pair of connection circuits C1 and C2 are circuits connected in a state in which the front row (the first row) and the rear row (the second row) are parallel to each other. In the pair of connection circuits C1 and C2, as shown in the drawings, the first connection circuit C1 connects the (i−1)-th digital phase shift circuit B(i−1) located on the final stage in the front row (the first row) and the i-th digital phase shift circuit Bi. As shown in the drawings, the first connection circuit C1 includes five individual connection lines E1, E2a, E2b, E3a and E3b.

Among these individual connection lines E1, E2a, E2b, E3a and E3b, the first individual connection line E1 is a beltlike conductor configured to connect an output end (one end) of the signal line 1 in the (i−1)-th digital phase shift circuit B(i−1) and an input end (the other end) of the signal line 1 in the i-th digital phase shift circuit Bi. The first individual connection line E1 is a long plate-shaped conductor having a fixed width, a fixed thickness and a predetermined length, and extends diagonally as shown in the drawings (when seen in a plan view shown in FIG. 1).

The second individual connection line E2a is a beltlike conductor configured to connect one end of the first inner line 2a in the (i−1)-th digital phase shift circuit B(i−1) and the other end of the first inner line 2a of the i-th digital phase shift circuit Bi. The second individual connection line E2a is a long plate-shaped conductor having a fixed width, a fixed thickness and a predetermined length, and extends diagonally like the first individual connection line E1.

The third individual connection line E2b is a beltlike conductor configured to connect one end of the second inner line 2b in the (i−1)-th digital phase shift circuit B(i−1) and the other end of the second inner line 2b in the i-th digital phase shift circuit Bi. The third individual connection line E2b is a long plate-shaped conductor having a fixed width, a fixed thickness and a predetermined length, and extends diagonally like the first individual connection line E1.

The fourth individual connection line E3a is a beltlike conductor configured to connect one end of the first outer line 3a in the (i−1)-th digital phase shift circuit B(i−1) and the other end of the first outer line 3a in the i-th digital phase shift circuit Bi. The fourth individual connection line E3a is a long plate-shaped conductor having a fixed width, a fixed thickness and a predetermined length, and extends diagonally like the first individual connection line E1.

The fifth individual connection line E3b is a beltlike conductor configured to connect one end of the second outer line 3b in the (i−1)-th digital phase shift circuit B(i−) and the other end of the second outer line 3b in the i-th digital phase shift circuit Bi. The fifth individual connection line E3b is a long plate-shaped conductor having a fixed width, a fixed thickness and a predetermined length, and extends diagonally like the first individual connection line E1.

Meanwhile, as shown in the drawings, the second connection circuit C2 connects the i-th digital phase shift circuit Bi and the (i+1)-th digital phase shift circuit B(i+1) located on the foremost stage in the rear row (the second row). As shown in the drawings, the second connection circuit C2 includes five individual connection lines F1, F2a, F2b, F3a and F3b.

Among these individual connection lines F1, F2a, F2b, F3a and F3b, the sixth individual connection line F1 is a beltlike conductor configured to connect an output end (one end) of the signal line 1 in the i-th digital phase shift circuit Bi and an input end (the other end) of the signal line 1 in the (i+1)-th digital phase shift circuit B(i+1). The sixth individual connection line F1 is a long plate-shaped conductor having a fixed width, a fixed thickness and a predetermined length, and extends diagonally as shown in the drawings (when seen in a plan view shown in FIG. 1).

The seventh individual connection line F2a is a beltlike conductor configured to connect one end of the first inner line 2a in the i-th digital phase shift circuit Bi and the other end of the first inner line 2a in the (i+1)-th digital phase shift circuit B(i+1). The seventh individual connection line F2a is a long plate-shaped conductor having a fixed width, a fixed thickness and a predetermined length, and extends diagonally like the sixth individual connection line F1.

The eighth individual connection line F2b is a beltlike conductor configured to connect one end of the second inner line 2b in the i-th digital phase shift circuit Bi and the other end of the second inner line 2b in the (i+1)-th digital phase shift circuit B(i+1). The eighth individual connection line F2b is a long plate-shaped conductor having a fixed width, a fixed thickness and a predetermined length, and extends diagonally like the sixth individual connection line PH.

The ninth individual connection line F3a is a beltlike conductor configured to connect one end of the first outer line 3a in the i-th digital phase shift circuit Bi and the other end of the first outer line 3a in the (i+1)-th digital phase shift circuit B(i+1). The ninth individual connection line F3a is a long plate-shaped conductor having a fixed width, a fixed thickness and a predetermined length, and extends diagonally like the sixth individual connection line F1.

The tenth individual connection line F3b is a beltlike conductor configured to connect one end of the second outer line 3b in the i-th digital phase shift circuit Bi and the other end of the second outer line 3b in the (i+1)-th digital phase shift circuit B(i+1). The tenth individual connection line F3b is a long plate-shaped conductor having a fixed width, a fixed thickness and a predetermined length, and extends diagonally like the sixth individual connection line F1.

Here, reference sign P1 in FIG. 1 shows an input position (a front row input position) of the first digital phase shift circuit B1 located at the uppermost side in the front row (the first row) (a front row uppermost side digital phase shift circuit). In addition, reference sign P2 shows an input position (a rear row input position) of the (i+1)-th digital phase shift circuit B(i+1) located at the foremost stage in the rear row (the second row) (a rear row uppermost side digital phase shift circuit).

In the digital phase shifter A1 according to the first embodiment, a natural number "i" is set to a range of 8 to 14 as shown in the drawings. That is, in the digital phase shifter A1, the number of the digital phase shift circuits B from the front row input position P1 to the rear row input position P2 is set to 8 to 14. The grounds for this number are described below.

Next, detailed configurations of the digital phase shift circuits B1 to Bn according to the first embodiment are described. As shown by representative reference sign B in FIG. 2, each of the digital phase shift circuits B1 to Bn includes a capacitor 5, connection conductors 6, four electronic switches 7 (a first electronic switch 7a, a second electronic switch 7b, third electronic switch 7c and a fourth electronic switch 7d) and the switch controller 8, in addition to the signal line 1, the pair of inner lines 2 (the first inner line 2a and the second inner line 2b), the pair of outer lines 3 (the first outer line 3a and the second outer line 3b), and the pair of ground conductors 4 (the first ground conductor 4a and the second ground conductor 4b).

Figure 2:
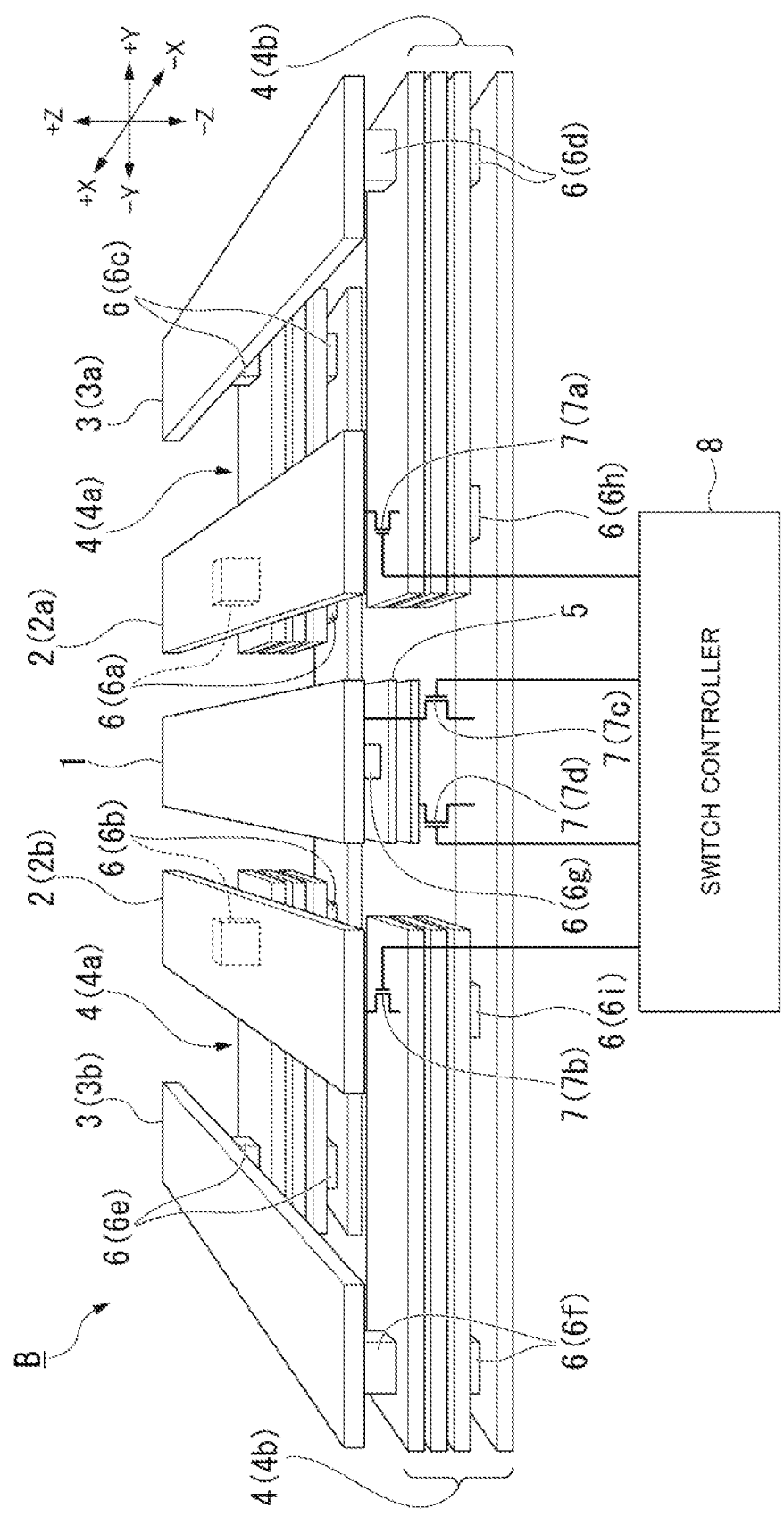
FIG. 2 is a conceptual view showing a functional configuration of a digital phase shift circuit B according to the first embodiment of the present invention.

The signal line 1 is a linear beltlike conductor extending in a predetermined direction. That is, the signal line 1 is a long plate-shaped conductor having a fixed width, a fixed thickness and a predetermined length. In FIG. 2, a high frequency signal flows through the signal line 1 from a front side toward a back side. The high frequency signal is a signal having a frequency band such as microwaves, sub-millimeter waves, millimeter waves, or the like.

Further, in FIG. 2, the forward/rearward direction of the digital phase shift circuit B is referred to as an X-axis direction, the leftward/rightward direction is referred to as a Y-axis direction, and the upward/downward direction (vertical direction) is referred to as a Z-axis direction. In addition, a +X direction is a direction from a front side toward a back side in the X-axis direction, and a −X direction is a direction directed opposite to the +X direction. A +Y direction is a direction directed rightward in the Y-axis direction, and a −Y direction is a direction directed opposite to the +Y direction. A +Z direction is a direction directed upward in the Z-axis direction, and a −Z direction is a direction directed opposite to the +Z direction.

The pair of inner lines 2 (the first inner line 2a and the second inner line 2b) are linear beltlike conductors provided on both sides of the signal line 1. The first inner line 2a is long plate-shaped conductors having a fixed width, a fixed thickness and a predetermined length. The first inner line 2a extends in the same direction as the extension direction of the signal line 1. The first inner line 2a is provided parallel to the signal line 1 with separated by a predetermined distance. Specifically, the first inner line 2a is disposed on one side of the signal line 1 with separated by a predetermined distance. In other words, the first inner line 2a is disposed separated from the signal line 1 by a predetermined distance in the +Y direction.

Like the first inner line 2a, the second inner line 2b has a long plate-shaped conductor having a fixed width, a fixed thickness and a predetermined length. The second inner line 2b extends in the same direction as the extension direction of the signal line 1. The second inner line 2b is provided parallel to the signal line 1 with separated by a predetermined distance. Specifically, the second inner line 2b is disposed on the other side of the signal line 1 with separated by a predetermined distance. In other words, the second inner line 2b is disposed separated from the signal line 1 by a predetermined distance in the −Y direction.

The pair of outer lines 3 (the first outer line 3a and the second outer line 3b) are linear beltlike conductors provided on outer sides of the inner lines. The first outer line 3a is a linear beltlike conductor provided on one side of the signal line 1 at a position farther from the signal line 1 than the first inner line 2a.

That is, the first outer line 3a is a linear beltlike conductor disposed further in the +Y direction than the first inner line 2a. The first outer line 3a is a long plate-shaped conductor having a fixed width, a fixed thickness and a predetermined length. The first outer line 3a is provided parallel to the signal line 1 while being separated from the signal line 1 by a predetermined distance with the first inner line 2a sandwiched therebetween. Like the first inner line 2a and the second inner line 2b, the first outer line 3a extends in the same direction as the extension direction of the signal line 1.

The second outer line 3b is a linear beltlike conductor provided on the other side of the signal line 1 at a position farther from the signal line 1 than the second inner line 2b. That is, the second outer line 3b is a linear beltlike conductor disposed further in the −Y direction than the second inner line 2b. Like the first outer line 3a, the second outer line 3b is a long plate-shaped conductor having a fixed width, a fixed thickness and a predetermined length. The second outer line 3b is provided parallel to the signal line 1 while being separated from the signal line 1 by a predetermined distance with the second inner line 2b sandwiched therebetween. Like the first inner line 2a and the second inner line 2b, the second outer line 3b extends in the same direction as the extension direction of the signal line 1.

The first ground conductor 4a is a linear beltlike conductor provided on one end side of the first inner line 2a, the second inner line 2b, the first outer line 3a and the second outer line 3b. The first ground conductor 4a is electrically connected to one ends of the first inner line 2a, the second inner line 2b, the first outer line 3a and the second outer line 3b. The first ground conductor 4a is a long plate-shaped conductor having a fixed width, a fixed thickness and a predetermined length.

The first ground conductor 4a is provided perpendicular to the first inner line 2a, the second inner line 2b, the first outer line 3a and the second outer line 3b extending in the same direction. That is, the first ground conductor 4a is disposed to extend in the Y-axis direction. The first ground conductor 4a is provided below the first inner line 2a, the second inner line 2b, the first outer line 3a and the second outer line 3b with separated by a predetermined distance.

In the example shown in FIG. 2, the first ground conductor 4a is set such that one end that is an end in the +Y direction of the first ground conductor 4a is located at substantially the same position as a right side edge portion of the first outer line 3a. In the example shown in FIG. 2, the first ground conductor 4a is set such that the other end that is an end in the −Y direction of the first ground conductor 4a is located at substantially the same position as a left side edge portion of the second outer line 3b.

The second ground conductor 4b is a linear beltlike conductor provided on the other end side of the first inner line 2a, the second inner line 2b, the first outer line 3a and the second outer line 3b. Like the first ground conductor 4a, the second ground conductor 4b is a long plate-shaped conductor having a fixed width, a fixed thickness and a predetermined length.

The second ground conductor 4b is disposed parallel to the first ground conductor 4a, and like the first ground conductor 4a, provided perpendicular to the first inner line 2a, the second inner line 2b, the first outer line 3a and the second outer line 3b. The second ground conductor 4b is provided below the first inner line 2a, the second inner line 2b, the first outer line 3a and the second outer line 3b with separated by a predetermined distance.

The second ground conductor 4b is provided such that one end that is an end in the +Y direction of the second ground conductor 4b is located at substantially the same position as a right side edge portion of the first outer line 3a. The second ground conductor 4b is set such that the other end that is an end in the −Y direction of the second ground conductor 4b is located at substantially the same position as a left side edge portion of the second outer line 3b. In FIG. 2, the second ground conductor 4b is located at the same position as the first ground conductor 4a in the Y-axis direction.

As shown in FIG. 2, a multilayer structure is formed in regions between the outer lines 3 and the inner lines 2 on both of the first ground conductor 4a and the second ground conductor 4b. Further, the regions between the outer lines 3 and the inner lines 2 include a region between the first outer line 3a and the first inner line 2a, and a region between the second outer line 3b and the second inner line 2b.

However, on only one of the first ground conductor 4a and the second ground conductor 4b, a multilayer structure may be formed between the outer lines 3 and the inner lines 2. When the first ground conductor 4a is formed in the multilayer structure, the layers thereof are connected to each other through via holes. Similarly, when the second ground conductor 4b is formed in the multilayer structure, the layers thereof are connected to each other through via holes (for example, connection conductor 6h or 6i, which are described below).

The capacitor 5 is provided between the signal line 1 and the first ground conductor 4a or the second ground conductor 4b. For example, the capacitor 5 includes an upper electrode connected to the signal line 1 and a lower electrode electrically connected to the fourth electronic switch 7d. For example, the capacitor 5 is a thin film capacitor formed in a metal insulator metal (MIM) structure. Further, the capacitor 5 may be a parallel plate type capacitor or may be an opposite comb type capacitor (an interdigital capacitor).

The connection conductors 6 include at least the connection conductors 6a to 6i. The connection conductor 6a is a conductor configured to electrically and mechanically connect one end of the first inner line 2a and the first ground conductor 4a. For example, the connection conductor 6a is a conductor extending in the Z-axis direction, and has one end (an upper end) connected to a lower surface of the first inner line 2a and the other end (a lower end) connected to an upper surface of the first ground conductor 4a. In addition, the connection conductor 6a connects the first ground conductor 4a formed in the multilayer structure between the first inner line 2a and the first outer line 3a (connects the layers that form the first ground conductor 4a).

The connection conductor 6b is a conductor configured to electrically and mechanically connect one end of the second inner line 2b and the first ground conductor 4a. For example, the connection conductor 6b is a conductor extending in the Z-axis direction like the connection conductor 6a, and has one end (an upper end) connected to a lower surface of the second inner line 2b and the other end (a lower end) connected to an upper surface of the first ground conductor 4a. In addition, the connection conductor 6b connects the first ground conductor 4a formed in the multilayer structure between the second inner line 2b and the second outer line 3b (connects the layers that form the first ground conductor 4a).

The connection conductor 6c is a conductor configured to electrically and mechanically connect one end of the first outer line 3a and the first ground conductor 4a. For example, the connection conductor 6c is a conductor extending in the Z-axis direction, and has one end (an upper end) connected to a lower surface in one end of the first outer line 3a and the other end (a lower end) connected to an upper surface of the first ground conductor 4a. In addition, the connection conductor 6c connects the first ground conductor 4a formed in the multilayer structure between the first inner line 2a and the first outer line 3a (connects the layers that form the first ground conductor 4a).

The connection conductor 6d is a conductor configured to electrically and mechanically connect the other end of the first outer line 3a and the second ground conductor 4b. For example, the connection conductor 6d is a conductor extending in the Z-axis direction, and has one end (an upper end) connected to a lower surface in the other end of the first outer line 3a and the other end (a lower end) connected to an upper surface of the second ground conductor 4b. In addition, the connection conductor 6d connects the second ground conductor 4b formed in the multilayer structure between the first inner line 2a and the first outer line 3a (connects the layers that form the second ground conductor 4b).

The connection conductor 6e is a conductor configured to electrically and mechanically connect one end of the second outer line 3b and the first ground conductor 4a. For example, the connection conductor 6e is a conductor extending in the Z-axis direction, and has one end (an upper end) connected to a lower surface in one end of the second outer line 3b and the other end (a lower end) connected to an upper surface of the first ground conductor 4a. In addition, the connection conductor 6e connects the first ground conductor 4a formed in the multilayer structure between the second inner line 2b and the second outer line 3b (connects the layers that form the first ground conductor 4a).

The connection conductor 6f is a conductor configured to electrically and mechanically connect the other end of the second outer line 3b and the second ground conductor 4b. For example, the connection conductor 6f is a conductor extending in the Z-axis direction, and has one end (an upper end) connected to a lower surface in the other end of the second outer line 3b and the other end (a lower end) connected to an upper surface of the second ground conductor 4b. In addition, the connection conductor 6f connects the second ground conductor 4b formed in the multilayer structure between the second inner line 2b and the second outer line 3b (connects the layers that form the second ground conductor 4b).

The connection conductor 6g is a conductor configured to electrically and mechanically connect the other end of the signal line 1 and the upper electrode of the capacitor 5. For example, the connection conductor 6g is a conductor extending in the Z-axis direction, and has one end (an upper end) connected to a lower surface in the other end of the signal line 1 and the other end (a lower end) connected to the upper electrode of the capacitor 5.

The connection conductor 6h and the connection conductor 6i connect the second ground conductor 4b formed in the multilayer structure. That is, each of the connection conductor 6h and the connection conductor 6i connects the layers that form the second ground conductor 4b. The connection conductor 6h connects the second ground conductor 4b in the multilayer structure further in the +Y direction than the signal line 1. The connection conductor 6i connects the second ground conductor 4b in the multilayer structure further in the −Y direction than the signal line 1.

The first electronic switch 7a is connected to the other end of the first inner line 2a and the second ground conductor 4b therebetween. The first electronic switch 7a is, for example, a metal oxide semiconductor field effect transistor (MOSFET), and includes a drain terminal electrically connected to the other end of the first inner line 2a, a source terminal electrically connected to the second ground conductor 4b and a gate terminal electrically connected to the switch controller 8.

As shown in FIG. 2, the source terminal of the first electronic switch 7a is connected to a near layer of the second ground conductor 4b in the multilayer structure. That is, the source terminal of the first electronic switch 7a is connected to a layer close to the first electronic switch 7a of the multiple layers that form the second ground conductor 4b. However, it is not limited thereto, and the source terminal of the first electronic switch 7a may be connected to at least one layer of the second ground conductor 4b in the multilayer structure.

The first electronic switch 7a is controlled to a closed state or an open state based on the gate signal input to the gate terminal from the switch controller 8. The closed state is a state in which the drain terminal and the source terminal are conducted. The open state is a state in which the drain terminal and the source terminal are not conducted and the electrical connection thereof is disconnected. The first electronic switch 7a is switched to a conduction state in which the other end of the first inner line 2a and the second ground conductor 4b are electrically connected or a disconnection state in which the electrical connection therebetween is disconnected under control of the switch controller 8.

The second electronic switch 7b is connected to the other end of the second inner line 2b and the second ground conductor 4b therebetween. The second electronic switch 7b is, for example, a MOSFET, and includes a drain terminal connected to the other end of the second inner line 2b, a source terminal connected to the second ground conductor 4b and a gate terminal connected to the switch controller 8. As shown in FIG. 2, the source terminal of the second electronic switch 7b is connected to a near layer of the second ground conductor 4b in the multilayer structure. That is, the source terminal of the second electronic switch 7b is connected to a layer close to the second electronic switch 7b of the multiple layers that form the second ground conductor 4b. However, it is not limited thereto, and the source terminal of the second electronic switch 7b may be connected to at least one layer of the second ground conductor 4b in the multilayer structure.

The second electronic switch 7b is controlled to a closed state or an open state based on the gate signal input to the gate terminal from the switch controller 8. The second electronic switch 7b is switched to a conduction state in which the other end of the second inner line 2b and the second ground conductor 4b are electrically connected or a disconnection state in which the electrical connection therebetween is disconnected under control of the switch controller 8.

The third electronic switch 7c is connected to the other end of the signal line 1 and the second ground conductor 4b therebetween. The third electronic switch 7c is, for example, a MOSFET, and includes a drain terminal connected to the other end of the signal line 1, a source terminal connected to the second ground conductor 4b and a gate terminal connected to the switch controller 8. Further, as shown in FIG. 2, while the third electronic switch 7c is provided on the other end side of the signal line 1, it is not limited thereto and may be provided on one end side of the signal line 1.

The third electronic switch 7c is controlled to a closed state or an open state based on the gate signal input to the gate terminal from the switch controller 8. The third electronic switch 7c is switched to a conduction state in which the other end of the signal line 1 and the second ground conductor 4b are electrically connected or a disconnection state in which the electrical connection therebetween is disconnected under control of the switch controller 8.

The fourth electronic switch 7d is an electronic switch for a capacitor serially connected to the capacitor 5 between the other end of the signal line 1 and the second ground conductor 4b. The fourth electronic switch 7d is, for example, a MOSFET. As shown in FIG. 2, the fourth electronic switch 7d includes a drain terminal connected to a lower electrode of the capacitor 5, a source terminal connected to the second ground conductor 4b and a gate terminal connected to the switch controller 8.

The fourth electronic switch 7d is controlled to a closed state or an open state based on the gate signal input to the gate terminal from the switch controller 8. The fourth electronic switch 7d is switched to a conduction state in which the lower electrode of the capacitor 5 and the second ground conductor 4b are electrically connected or a disconnection state in which the electrical connection therebetween is disconnected under control of the switch controller 8.

The switch controller 8 is a control circuit configured to control the first electronic switch 7a, the second electronic switch 7b, the third electronic switch 7c and the fourth electronic switch 7d, which are the electronic switches 7. For example, the switch controller 8 includes four output ports. The switch controller 8 individually controls the electronic switches 7 to an open state or a closed state by outputting individual gate signals from the individual output ports and supplying the signals to the individual gate terminals of the electronic switches 7.

Here, while FIG. 2 shows a schematic perspective view of the digital phase shift circuit B so that a mechanical structure of the digital phase shift circuit B can be easily understood, the actual digital phase shift circuit B is a multilayer structure using a semiconductor manufacturing technology. For example, the digital phase shift circuit B includes the signal line 1, the first inner line 2a, the second inner line 2b, the first outer line 3a and the second outer line 3b, which are formed on the first conductive layer.

In addition, the first ground conductor 4a and the second ground conductor 4b are formed on the second conductive layers facing the first conductive layer with the insulating layer sandwiched therebetween. The components formed on the first conductive layer and the components formed on the second conductive layers are connected to each other by via holes (via-holes). In addition, the connection conductors 6 correspond to the via holes embedded in the insulating layer.

Further, the inner line 2, the outer line 3 and the uppermost layer of the ground conductor 4 in the multilayer structure may be connected in the same layer. That is, the inner line 2, the outer line 3, and the uppermost layer of the multiple layer that constitute the ground conductor 4 may be located at the same positions in the Z-axis direction and connected to each other. For example, the first inner line 2a, the first outer line 3a, and the uppermost layers of the first ground conductor 4a and the second ground conductor 4b in the multilayer structure may be connected in the same layer. In addition, the second inner line 2b, the second outer line 3b and the uppermost layers of the first ground conductor 4a and the second ground conductor 4b in the multilayer structure may be connected in the same layer.

Figure 3:
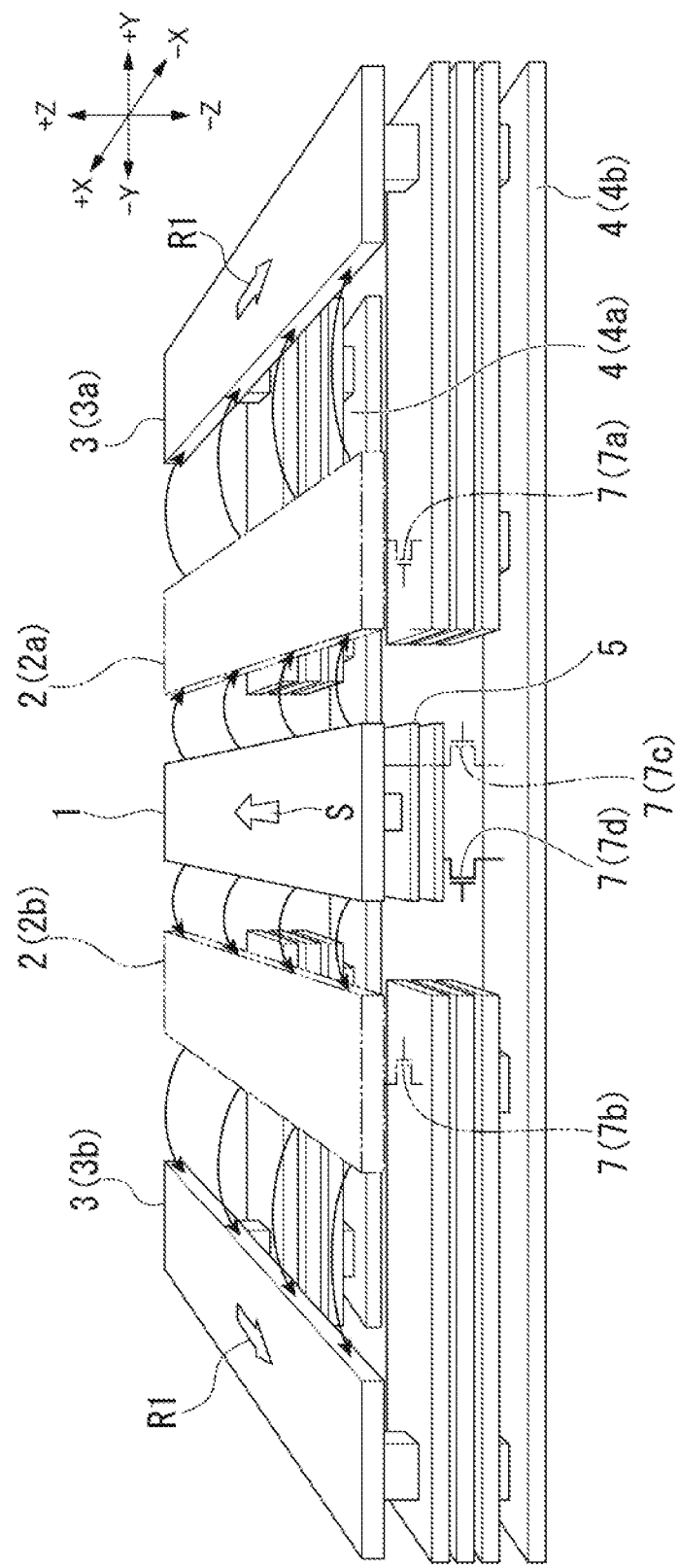
FIG. 3 is a schematic view showing a conduction route of a return current upon a high delay mode in the digital phase shift circuit B according to the first embodiment of the present invention.

Next, an operation of the digital phase shift circuit B according to the first embodiment are described with reference to FIG. 3 and FIG. 4. The digital phase shift circuit B has a high delay mode and a low delay mode as operation modes. That is, the digital phase shift circuit B is operated in the high delay mode or the low delay mode.

[High Delay Mode]

The high delay mode is a mode in which a first phase difference is generated in a high frequency signal S. As shown in FIG. 3, in the high delay mode, the first electronic switch 7a and the second electronic switch 7b are controlled to the open state, and the fourth electronic switch 7d is controlled to the closed state.

When the first electronic switch 7a is controlled to the open state, electrical connection between the other end of the first inner line 2a and the second ground conductor 4b is disconnected. When the second electronic switch 7b is controlled to the open state, connection between the other end of the second inner line 2b and the second ground conductor 4b of the multilayer structure is disconnected. When the fourth electronic switch 7d is controlled to the closed state, the other end of the signal line 1 is connected to the second ground conductor 4b through the capacitor 5.

When the high frequency signal S is propagated through the signal line 1 from the input end (the other end) toward the output end (one end), a return current R1 flows from one end toward the other end in a direction opposite to the high frequency signal S (opposite to a direction in which the high frequency signal S propagates). That is, the return current R1 is a current flowing in the −X direction that is a direction opposite to the high frequency signal S flowing in the +X direction. In the high delay mode, since the first electronic switch 7a and the second electronic switch 7b are in the open state, as shown in FIG. 3, the return current R1 mainly flows through the first outer line 3a and the second outer line 3b in the −X direction.

In the high delay mode, since the return current R1 flows through the first outer line 3a and the second outer line 3b, an inductance value L is higher than that in the low delay mode. In addition, since the fourth electronic switch 7d is in the closed state, the capacitor 5 is working. For this reason, in the high delay mode, a delay quantity greater than that in the low delay mode can be obtained.

[Low Delay Mode]

The low delay mode is a mode in which a second phase difference smaller than the first phase difference is generated in the high frequency signal S. In the low delay mode, as shown in FIG. 4, the first electronic switch 7a and the second electronic switch 7b are controlled to the closed state, and the fourth electronic switch 7d is controlled to the open state.

When the first electronic switch 7a is controlled to the closed state, the other end of the first inner line 2a and the second ground conductor 4b are electrically connected. When the second electronic switch 7b is controlled to the closed state, the other end of the second inner line 2b and the second ground conductor 4b are electrically connected.

Figure 4:
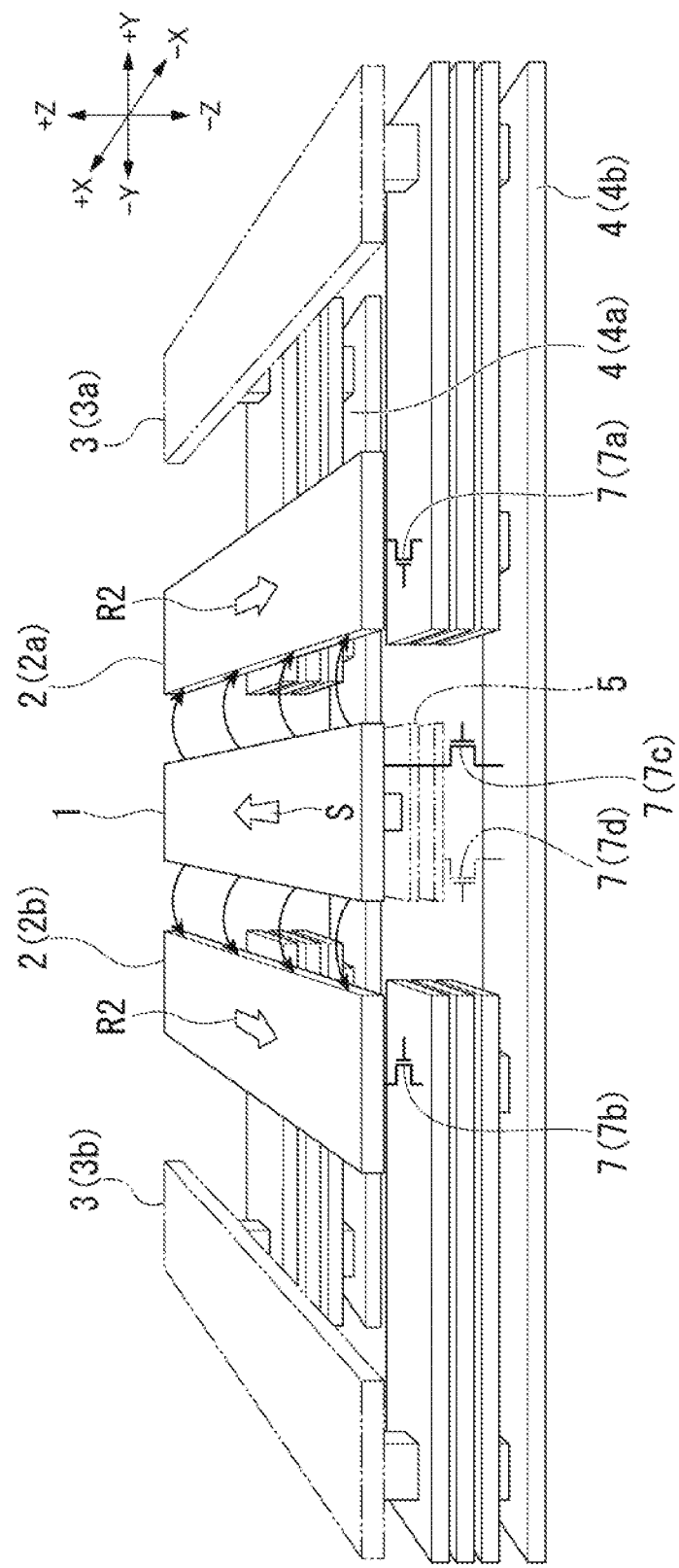
FIG. 4 is a schematic view showing a conduction route of a return current upon a low delay mode in the digital phase shift circuit B according to the first embodiment of the present invention.

In the low delay mode, since the first electronic switch 7a and the second electronic switch 7b are in the closed state, as shown in FIG. 4, a return current R2 mainly flows through the first inner line 2a and the second inner line 2b in the −X direction. In the low delay mode, since the return current R2 flows through the first inner line 2a and the second inner line 2b, the inductance value L is lower than that in the high delay mode. In addition, since the fourth electronic switch 7d is in the open state, the capacitor 5 is not working. For this reason, a capacitance value C is smaller than that in the high delay mode. For this reason, a delay quantity in the low delay mode is lower than a delay quantity in the high delay mode.

Here, the high delay mode has a loss of the high frequency signal greater than that in the low delay mode. Since the loss of the high frequency signal in the high delay mode is different from the loss of the high frequency signal in the low delay mode, the loss of the high frequency signal (signal amplitude) may be varied according to the phase shift quantity. Accordingly, in the digital phase shifter A1 in which the plurality of digital phase shift circuits B1 to Bn are cascade-connected as shown in FIG. 1 or FIG. 5, a phenomenon can occur in which the loss of the high frequency signal increases as the phase shift quantity increases.

In each of the digital phase shift circuits B1 to Bn, in order to reduce an unbalance of signal amplitude of the high frequency signal, i.e., a difference between the loss of the high frequency signal in the high delay mode and the loss of the high frequency signal in the low delay mode, the first ground conductor 4a and the second ground conductor 4b outside the inner line 2 are formed in the multilayer structure as an example. According to the above-mentioned configuration, a resistance value of the ground conductor 4 between the outer line 3 and the inner line 2 can be lowered, and the loss of the high frequency signal in the high delay mode can be reduced. Accordingly, the unbalance of the signal amplitudes between the high delay mode and the low delay mode can be reduced.

Next, in the digital phase shifter A1 according to the first embodiment, the reason for setting the number (optimum value) of the first to the i-th digital phase shift circuit B1 to Bi between the front row input position P1 to the rear row input position P2 to 8 to 14 and an effect obtained by setting the optimum value to 8 to 14 are described in detail.

Figure 5:
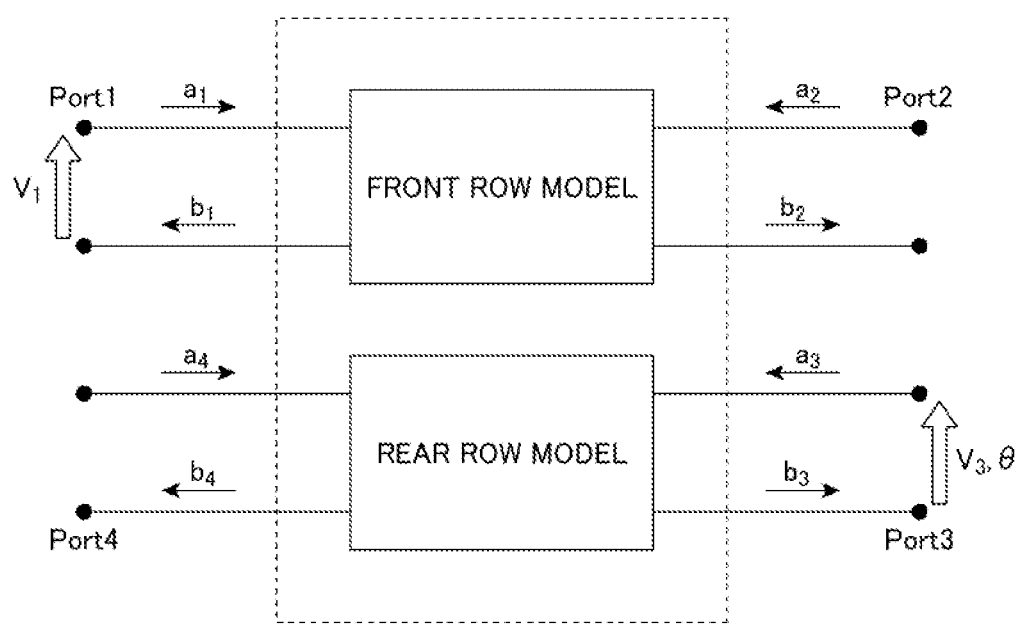
FIG. 5 is an analytical model for analyzing properties of the digital phase shifter A1 according to the first embodiment of the present invention.

As shown in FIG. 5, the front row (the first row), the connection circuit C1, the digital phase shift circuit Bi, the connection circuit C2 and the rear row (the second row) in the digital phase shifter A1 can be equivalently represented by an analytical model including Port 1 to Port 4 and a front row model and a rear row model. Port 1, Port 2 and the front row model correspond to the front row (the first row), the connection circuit C1, the digital phase shift circuit Bi and the connection circuit C2 of the digital phase shifter A1, and Port 3, Port 4 and the rear row model correspond to the rear row (the second row) of the digital phase shifter A1. Further, a1 to a4, and b1 to b4 in the analytical model are amounts obtained by dividing voltages by the square root of the reference resistance.

Port 1 corresponds to an input end of the front row (the first row), i.e., an input end of the first digital phase shift circuit B1, and includes an inflow terminal of the amount a1 flowing into the front row model and an output terminal of the amount b1 flowing out of the front row model. Port 2 corresponds to an output end of the connection circuit C2, i.e., an output end of the (i−1)-th digital phase shift circuit B(i−1), and includes an inflow terminal of the amount a2 flowing into the front row model and an output terminal of the amount b2 flowing out of the front row model.

In addition, Port 3 corresponds to an input end of the rear row (the second row), i.e., an input end of the (i+1)-th digital phase shift circuit B(i+1), and includes an inflow terminal of the amount a3 flowing into the rear row model and an output terminal of the amount b3 flowing out of the rear row model. Port 4 corresponds to an output end of the rear row (the second row), i.e., an output end of the n-th digital phase shift circuit Bn, and includes an inflow terminal of the amount a4 flowing into the rear row model and an output terminal of the amount b4 flowing out of the rear row model.

Here, when a high frequency signal of a first voltage amplitude V1 is input to Port 1 from an external signal source, a high frequency signal of a third voltage amplitude V3 with a phase changed by a phase θ with respect to the high frequency signal of the first voltage amplitude V1 is input to Port 3. The signal from Port 2 becomes a high frequency signal with the third voltage amplitude V3 and the phase θ and input into Port 3 through the pair of connection circuits C1 and C2 and the i-th digital phase shift circuit Bi that connect the front row (the first row) and the rear row (the second row).

The third voltage amplitude V3 (the magnitude of the third voltage amplitude V3) depends on a sum of the transmission loss in the front row (the first row), the transmission loss in the pair of connection circuits C1 and C2 and the transmission loss in the i-th digital phase shift circuit Bi. The phase θ (the quantity of the phase θ) depends on a sum of the phase shift quantity in the front row (the first row), the phase shift quantity in the pair of connection circuits C1 and C2 and the phase shift quantity in the i-th digital phase shift circuit Bi.

Provisionally, when there is no loss in the front row (the first row), the pair of connection circuits C1 and C2 and the i-th digital phase shift circuit Bi, the absolute value |V3| of the third voltage amplitude V3 is equal to the absolute value |V1| of the first voltage amplitude V1. In addition, when a parameter S in the front row model and the rear row model is set to "Sjk," a transmission coefficient of the high frequency signal from Port 1 to Port 2 is expressed as the following Equation (1), and a transmission coefficient of the high frequency signal from Port 3 to Port 4 is expressed as the following Equation (2).

$$b2/a1 = S21 + S23*(a3/a1) \quad (1)$$

$$b4/a3 = S43 + S41*(a1/a3) \quad (2)$$

Here, the phase θ can be determined such that a phase of a transmission coefficient b2/a1 or a phase of a transmission coefficient b4/a3 is set to a minimum value. The phase θ is provided as a function of the phase shift quantity in the front row (the first row), the phase shift quantity in the pair of connection circuits C1 and C2 and the phase shift quantity in the i-th digital phase shift circuit Bi based on the frequency f of the high frequency signal. When the phase of the transmission coefficient b2/a1 or the phase of the transmission coefficient b4/a3 is set to the minimum value, the digital phase shifter A1 can minimize a harmful influence of the inter-row connection structure based on the ground pattern D.

In the digital phase shifter A1, a direction of the return current R1 is reversed in the first outer lines 3a in the first to (i−1)-th digital phase shift circuits B1 to B(i−1) of the front row (the first row) and in the first outer lines 3a in the (i+1)-th to nth digital phase shift circuits B(i+1) to Bn of the rear row (the second row). In addition, in the digital phase shifter A1, the first outer lines 3a in a relation in which the direction of the return current R1 therein is reversed are connected to each other by the ground pattern D.

That is, in the digital phase shifter A1, with respect to the first outer lines 3a in the relation in which the direction of the return current R1 therein is reversed, the return current R1 of the first outer line 3a on one side is affected by the return current R1 of the first outer line 3a on the other side. As a result, there is a harmful influence in which a change (reduction) in phase shift quantity occurs with respect to a phase shift quantity (with respect to the original phase shift quantity) when the ground pattern D is not provided, i.e., when the inter-row connection structure is not provided.

A condition in which such a harmful influence, i.e., a change from the original phase shift quantity is minimized is a condition in which the phase of high frequency signal at the front row input position P1 and the phase of the high frequency signal at the rear row input position P2 are anti-phase with each other. That is, when a phase difference of 180° occurs between the phase at the front row input position P1 and the phase at the rear row input position P2, the change (reduction) from the original phase shift quantity can be minimized.

For example, when the frequency f of the high frequency signal is set to "30 GHz", the phase shift quantity upon the high delay mode of each of the digital phase shift circuits B1 to Bn is set to "17 degrees" and the phase shift quantity of each of the first and second connection circuits C1 and C2 is set to "8.8 degrees" (i.e., when the phase shift quantity of the pair of connection circuits C1 and C2 is set to 17.6 degrees), the phase θ where the phase of the transmission coefficient b2/a1 related to the front row (the first row), the connection circuit C1, the digital phase shift circuit Bi and the connection circuit C2 is minimized is set to 157 degrees.

Accordingly, when the optimum value of the digital phase shift circuit B is "x", the following Equation (3) is established.

$$17x + 8.8 \times 2 = 157 \quad (3)$$

Then, since 8.2 is obtained as the optimum value x by solving the Equation (3), "8" is obtained as the optimum value x by converting the 8.2 into an integer.

Meanwhile, the phase θ is set to 202 degrees such that the phase of the transmission coefficient b4/a3 related to the rear row (the second row) is set to the minimum value. Accordingly, when the optimum value of the digital phase shift circuit B is "x", the following Equation (4) is established.

$$17x + 8.8 \times 2 = 202 \quad (4)$$

Then, since 10.85 is obtained as the optimum value x by solving the Equation (4), "11" is obtained as the optimum value x by converting the 10.85 into an integer.

In addition, when the frequency f of the high frequency signal is set to "24 GHz", the optimum value x that minimizes the phase of the transmission coefficient b2/a1 related to the front row (the first row), the connection circuit C1, the digital phase shift circuit Bi and the connection circuit C2 is set to 10.96 ("11" as an integer) and 13.55 ("14" as an integer). Accordingly, when the digital phase shifter A1 according to the first embodiment is used in a frequency band of 24 to 30 GHz, the optimum value x is 8 to 14.

According to the above-mentioned first embodiment, since the optimum value x is set to 8 to 14, it is possible to suppress reduction in phase shift quantity due to a mutual interference between the first to (i−1)-th digital phase shift circuits B1 to B(i−1) and the (i+1)-th to n-th digital phase shift circuits B(i+1) to Bn neighboring between the rows in the multi-row structure and the inter-row connection structure. That is, according to the first embodiment, it is possible to provide the digital phase shifter A1 capable of suppressing reduction in phase shift quantity due to the mutual interference between the first to (i−1)-th digital phase shift circuits B1 to B(i−1) and the (i+1)-th to n-th digital phase shift circuits B(i+1) to Bn neighboring between the rows in the multi-row structure and the inter-row connection structure.

Second Embodiment

Next, a second embodiment of the present invention are described with reference to FIG. 6 and FIG. 7.

The digital phase shifter A2 according to the second embodiment is obtained by replacing the digital phase shift circuit B of the digital phase shifter A1 according to the first embodiment with a second digital phase shift circuit Ba.

Figure 6:
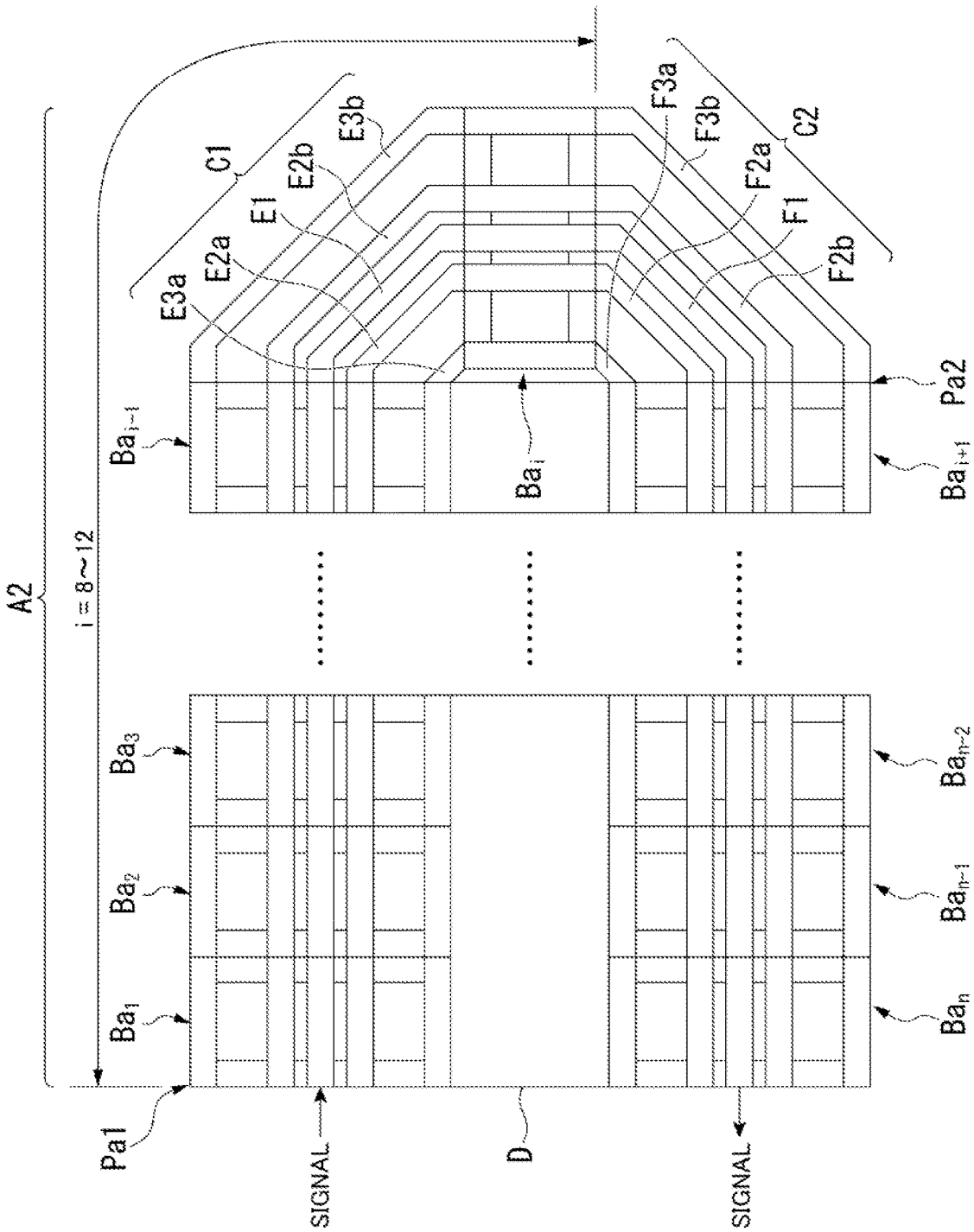
FIG. 6 is a plan view showing a configuration of a digital phase shifter A2 according to a second embodiment of the present invention.
Figure 7:
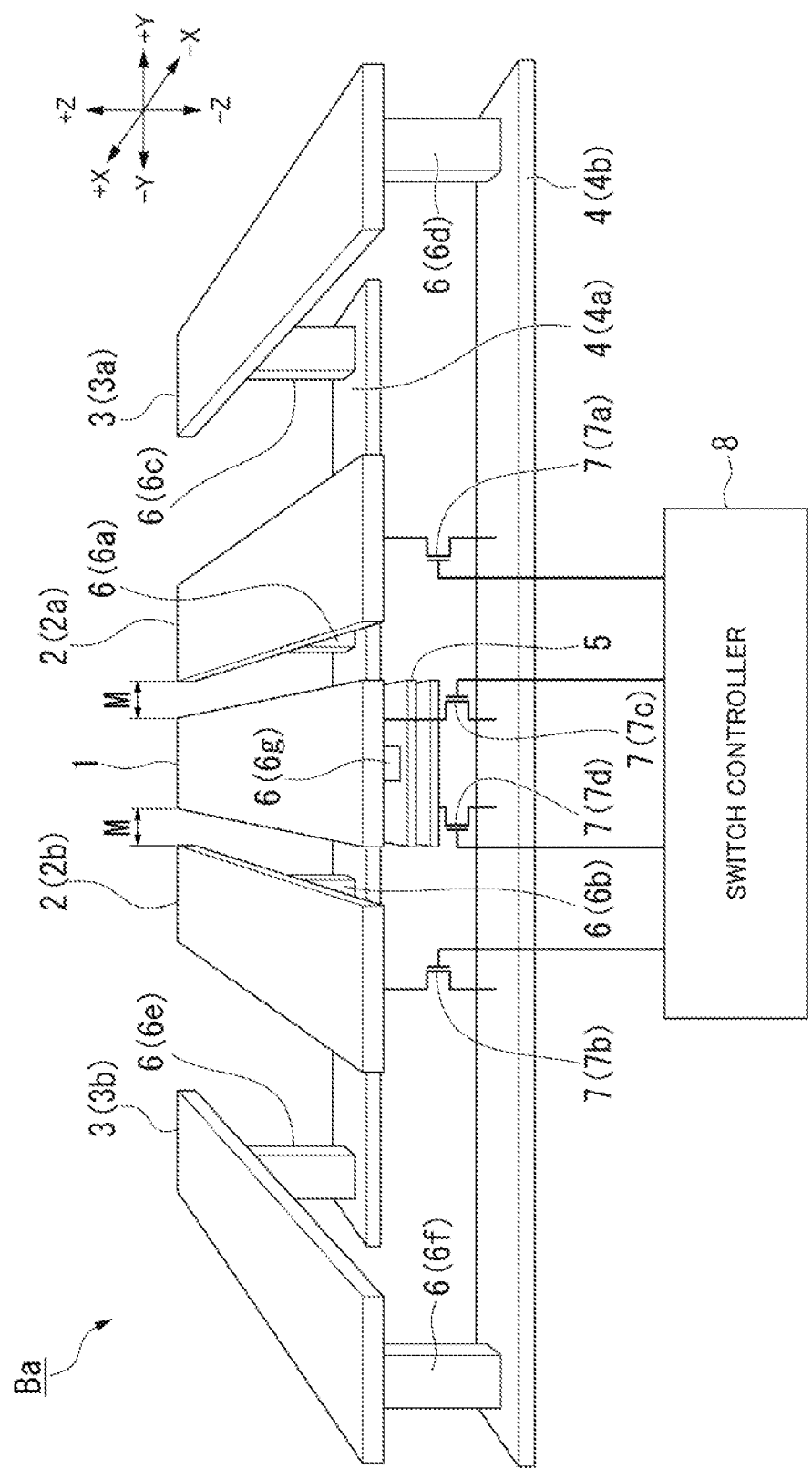
FIG. 7 is a conceptual view showing a functional configuration of a digital phase shift circuit Ba according to the second embodiment of the present invention.

Further, in FIG. 6 and FIG. 7, the same components as those in the above-mentioned first embodiment are designated by the same reference signs. Hereinafter, overlapping description of the same components as those in the first embodiment are omitted.

As shown in FIG. 6, the digital phase shifter A2 includes the n (plurality of) digital phase shift circuit Ba1 to Ban, each of which is constituted as the second digital phase shift circuit Ba, the pair of connection circuits C1 and C2 and the ground pattern D. In addition, in the digital phase shifter A2, as shown in the drawings, the number of the digital phase shift circuits Ba from a first digital phase shift circuit Ba1 (a front row uppermost side digital phase shift circuit) to the i-th digital phase shift circuit Bai between a front row input position Pa1 and a rear row input position Pa2 is set to 8 to 12.

Like the digital phase shifter A1 according to the first embodiment, the digital phase shifter A2 includes a multi-row structure related to the plurality of digital phase shift circuits Ba1 to Ban. In addition, like the digital phase shifter A1 according to the first embodiment, the digital phase shifter A2 includes an inter-row connection structure with the ground pattern D.

As shown in FIG. 7, the second digital phase shift circuit Ba includes the signal line 1, the two inner lines 2 (the first inner line 2a and the second inner line 2b), the two outer lines 3 (the first outer line 3a and the second outer line 3b), the two ground conductors 4 (the first ground conductor 4a and the second ground conductor 4b), the capacitor 5, the connection conductors 6, the four electronic switches 7 (the first electronic switch 7a, the second electronic switch 7b, the third electronic switch 7c and the fourth electronic switch 7d), and the switch controller 8.

That is, while the second digital phase shift circuit Ba includes the same components as those in the digital phase shift circuit B of the first embodiment, a distance M between the signal line 1 and the first inner line 2a and a distance M between the signal line 1 and the second inner line 2b in the second digital phase shift circuit Ba are smaller than those in the digital phase shift circuit B. It is desirable to bring the inner lines 2 (the first inner line 2a and the second inner line 2b) close to the signal line 1 up to a production limit or nearly up to a production limit, and the distance M is, for example, less than 10 μm, more preferably, 2 μm or less.

In addition, the digital phase shift circuit B of the first embodiment has a multilayer structure between the outer lines 3 and the inner lines 2 on the first ground conductor 4a and the second ground conductor 4b. On the other hand, the first ground conductor 4a and the second ground conductor 4b in the second digital phase shift circuit Ba have a single layer structure as shown in the drawings.

In the digital phase shifter A2 including the above-mentioned configuration, the optimum value of the digital phase shift circuits Ba1 to Bai are 8 to 12 as shown in FIG. 6. That is, the digital phase shifter A2 according to the second embodiment includes a configuration in which the natural number i is set to any one value within a range of 8 to 12.

In the digital phase shifter A2 according to the second embodiment, like the first embodiment, when the optimum value x within the frequency band of 37 to 40 GHz is obtained when the phase shift quantities upon the high delay mode of the digital phase shift circuits Ba1 to Ban are set to "14.5 degrees (37 GHz)" or "15.8 degrees (40 GHz)", and the phase shift quantities of the pair of connection circuits C1 and C2 are set to "10.3 degrees (37 GHz)" or "11.4 degrees (40 GHz)," the optimum value x is 8 to 12.

According to the above-mentioned second embodiment, since the optimum value x is set to 8 to 12, when the multi-row structure and the inter-row connection structure are provided, it is possible to suppress reduction in phase shift quantity due to the mutual interference between the first to (i−1)-th digital phase shift circuits Ba1 to Ba(i−1) and the (i+1)-th to n-th digital phase shift circuits Ba(i+1) to Ban neighboring between the front row (the first row) and the rear row (the second row).

That is, according to the second embodiment, when the multi-row structure and the inter-row connection structure are employed, it is possible to provide the digital phase shifter A2 capable of suppressing reduction in phase shift quantity due to the mutual interference between the first to (i−1)-th digital phase shift circuits Ba1 to Ba(i−1) and the (i+1)-th to n-th digital phase shift circuits Ba(i+1) to Ban neighboring between the rows.

Further, the digital phase shifter A1 according to the first embodiment and the digital phase shifter A2 according to the second embodiment include a two-row structure with two rows as an example of the multi-row structure. However, the present invention is not limited thereto, and may be applied to the digital phase shifter including a structure with three or more rows.

In addition, in the digital phase shifter A1 according to the first embodiment or the digital phase shifter A2 according to the second embodiment, the multilayer structure may be formed in a region on the outer lines 3. In this case, the digital phase shifters A1 or A2 may be configured such that the number (optimum value) of the first to i-th digital phase shift circuits B1 to Bi or Ba1 to Bai from the front row input positions P1 or Pa1 to the rear row input positions P2 or Pa2 is set to 8 to 14.

REFERENCE SIGNS

A1, A2 Digital phase shifter
B, B1 to Bn, Ba, Ba1 to Ban Digital phase shift circuit
C1, C2 Connection circuit
D Ground pattern
1 Signal line
2 Inner line
2a First inner line
2b Second inner line
3 Outer line
3a First outer line
3b Second outer line
4 Ground conductor
4a First ground conductor 4b Second ground conductor
5 Capacitor
6 Connection conductor
7 Electronic switch
7a First electronic switch
7b Second electronic switch
7c Third electronic switch
7d Fourth electronic switch (electronic switch for capacitor)
8 Switch controller

The invention claimed is:

1. A digital phase shifter in which digital phase shift circuits are cascade-connected, each of the digital phase shift circuits including at least a signal line, a pair of inner lines provided on both sides of the signal line, a pair of outer lines provided on outer sides of the inner lines, a first ground conductor connected to one ends of the inner lines and one ends of the outer lines, a second ground conductor connected to the other ends of the outer lines, and a pair of electronic switches provided between the other ends of the inner lines and the second ground conductor,
wherein the digital phase shift circuits include a multi-row structure constituted by a front row and a rear row by being connected through a predetermined connection circuit, and an inter-row connection structure in which the outer line in the front row and the outer line in the rear row neighboring in at least an inter-row direction are connected by a predetermined ground pattern, and
a number of the digital phase shift circuits from an input end of a front row uppermost side digital phase shift circuit located on an uppermost side in the front row to an input end of a rear row uppermost side digital phase shift circuit located on an uppermost side in the rear row is set such that a phase of a signal input to the front row uppermost side digital phase shift circuit and a phase of a signal input to the rear row uppermost side digital phase shift circuit are anti-phase with each other.

2. The digital phase shifter according to claim 1, wherein the number is 8 to 14 when a frequency band of the signal is 24 to 30 GHz.

3. The digital phase shifter according to claim 2, wherein the number is 8 to 14 when a multilayer structure is formed in at least one of a region between the outer line and the inner line on both or one of the first ground conductor and the second ground conductor and a region on the outer line.

4. The digital phase shifter according to claim 2, wherein the number is 8 to 12 when a distance from the signal line to the inner line is set to less than 10 μm.

5. The digital phase shifter according to claim 1, wherein the digital phase shift circuit includes a capacitor including an upper electrode connected to the signal line and a lower electrode connected to at least one of the first ground conductor and the second ground conductor.

6. The digital phase shifter according to claim 5, wherein the digital phase shift circuit further includes an electronic switch for the capacitor between the lower electrode of the capacitor and at least one of the first ground conductor and the second ground conductor.

* * * * *